(12) United States Patent
Balakrishnan et al.

(10) Patent No.: US 9,837,509 B2
(45) Date of Patent: Dec. 5, 2017

(54) SEMICONDUCTOR DEVICE INCLUDING STRAINED FINFET

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 20 days.

(21) Appl. No.: 14/746,963

(22) Filed: Jun. 23, 2015

(65) Prior Publication Data
US 2016/0359019 A1 Dec. 8, 2016

Related U.S. Application Data

(63) Continuation of application No. 14/732,840, filed on Jun. 8, 2015, now Pat. No. 9,653,580.

(51) Int. Cl.
*H01L 29/66* (2006.01)
*H01L 29/161* (2006.01)
*H01L 21/02* (2006.01)
*H01L 29/78* (2006.01)
*H01L 21/306* (2006.01)
(Continued)

(52) U.S. Cl.
CPC .... *H01L 29/66795* (2013.01); *H01L 21/0217* (2013.01); *H01L 21/02532* (2013.01); *H01L 21/30604* (2013.01); *H01L 29/161* (2013.01); *H01L 29/165* (2013.01); *H01L 29/41791* (2013.01); *H01L 29/6653* (2013.01); *H01L 29/66545* (2013.01); *H01L 29/7842* (2013.01);
(Continued)

(58) Field of Classification Search
CPC ................................................. H01L 21/823431
See application file for complete search history.

(56) References Cited

U.S. PATENT DOCUMENTS

2010/0109044 A1\* 5/2010 Tekleab .......... H01L 21/823807
257/190
2013/0154016 A1\* 6/2013 Glass ...................... H01L 29/78
257/368
(Continued)

OTHER PUBLICATIONS

Balakrishnan et al., "Semiconductor Device Including Strained Finfet", U.S. Appl. No. 14/732,840, filed Jun. 8, 2015.
(Continued)

*Primary Examiner* — Su C Kim
*Assistant Examiner* — David S Wilbert
(74) *Attorney, Agent, or Firm* — Cantor Colburn LLP; Louis Percello

(57) ABSTRACT

A semiconductor device includes at least one semiconductor fin on an upper surface of a base substrate. The at least one semiconductor fin includes a strained active semiconductor portion interposed between a protective cap layer and the base substrate. A gate stack wraps around the at least one semiconductor fin. The gate stack includes a metal gate element interposed between a pair of first cap segments of the protective cap layer. The strained active semiconductor portion is preserved following formation of the fin via the protective cap layer.

10 Claims, 22 Drawing Sheets

(51) Int. Cl.
*H01L 29/165* (2006.01)
*H01L 29/417* (2006.01)

(52) U.S. Cl.
CPC ...... *H01L 29/7849* (2013.01); *H01L 29/7851* (2013.01)

(56) References Cited

U.S. PATENT DOCUMENTS

2014/0252469 A1* 9/2014 Lee .................. H01L 29/66431
257/337
2015/0024573 A1* 1/2015 Jacob ................ H01L 21/76224
438/424
2015/0093868 A1* 4/2015 Obradovic ...... H01L 21/823431
438/283

OTHER PUBLICATIONS

List of IBM Patents or Patent Applications Treated as Related; (Appendix P), Filed Jul. 21, 2015; 2 pages.

* cited by examiner

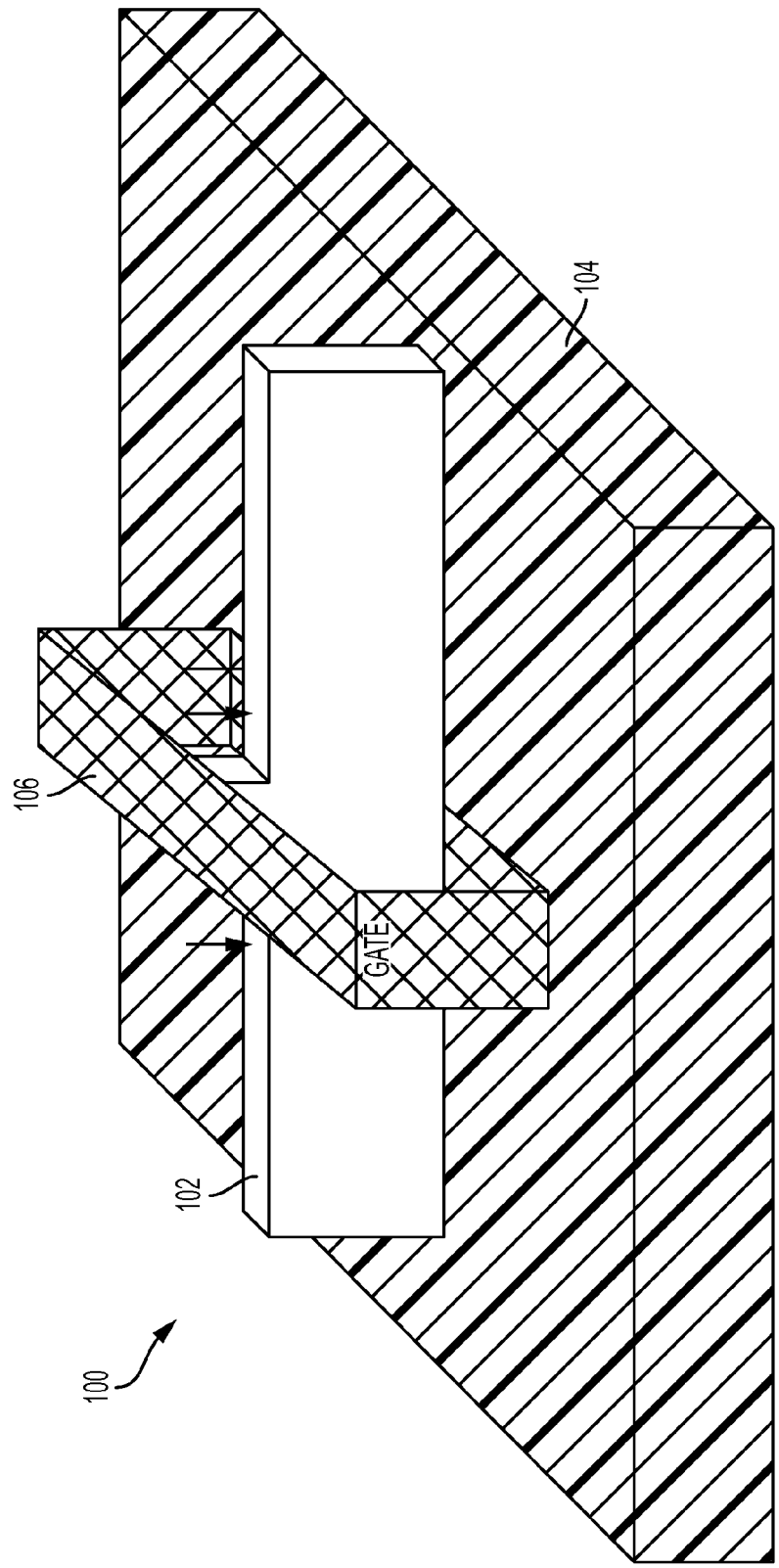

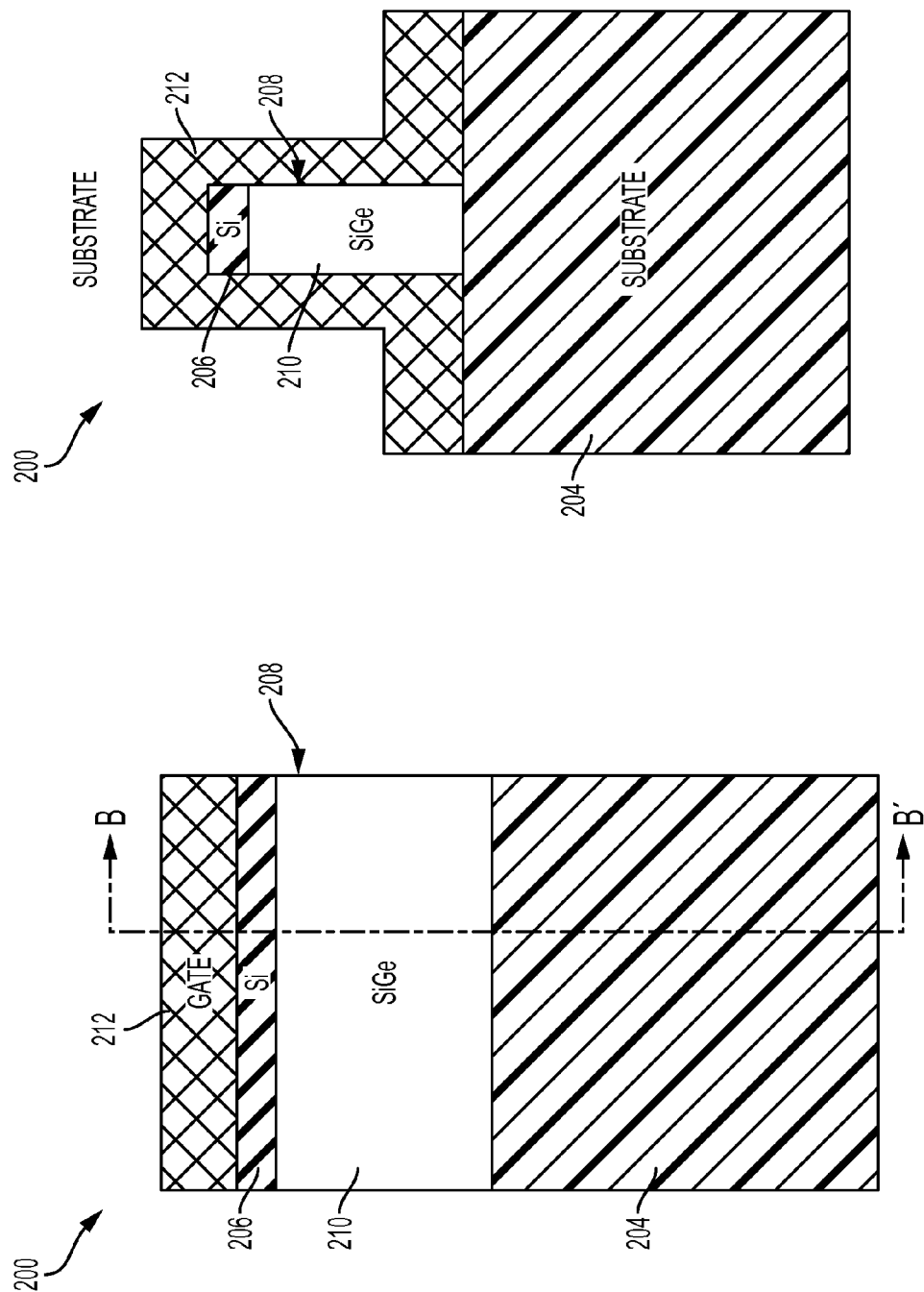

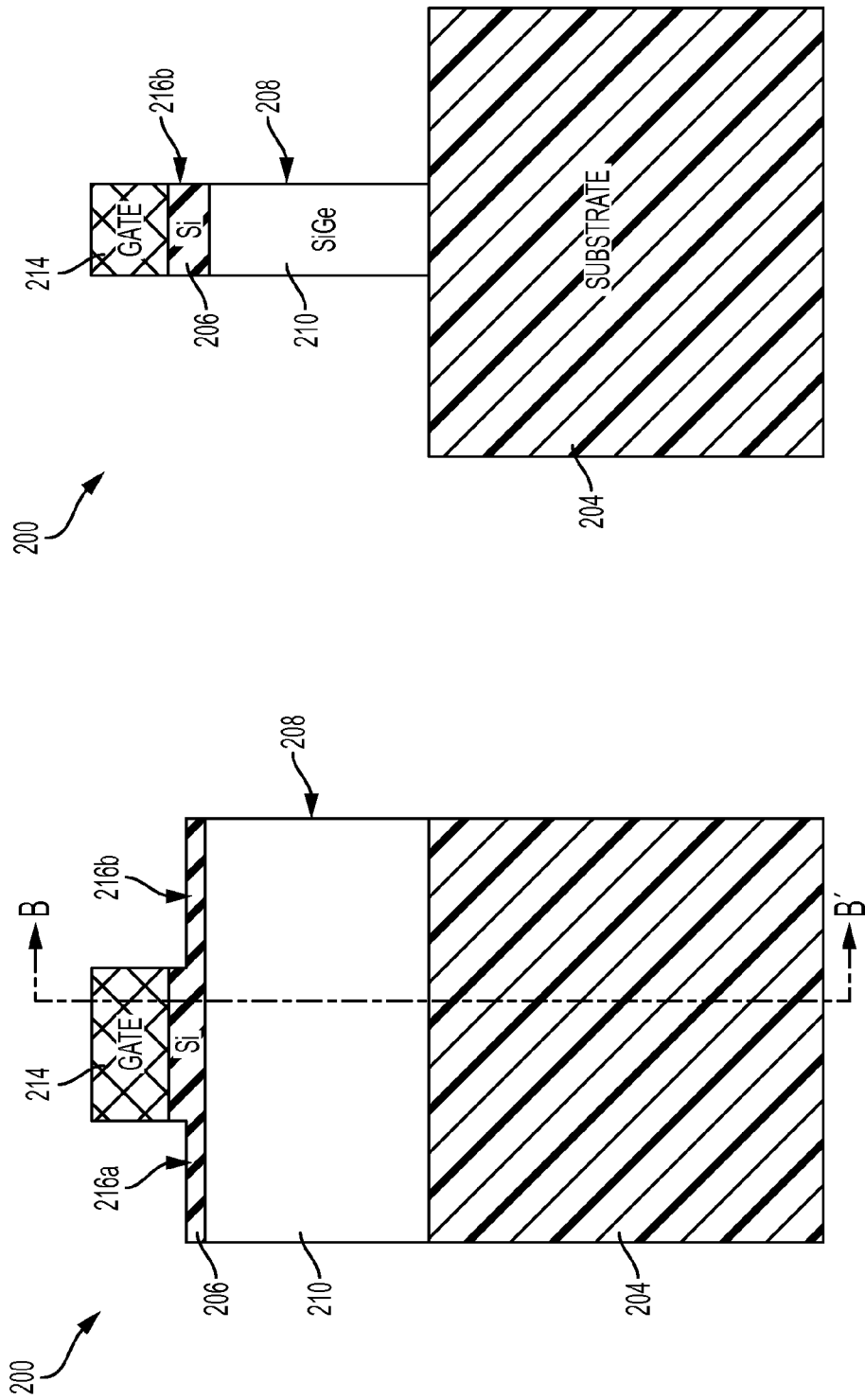

SEMICONDUCTOR DEVICE INCLUDING STRAINED FINFET

DOMESTIC PRIORITY

This application is a continuation of U.S. patent application Ser. No. 14/732,840, filed Jun. 8, 2015, the disclosure of which is incorporated by reference herein in its entirety.

BACKGROUND

The present invention relates to semiconductor devices, and more specifically, to finFET-type semiconductor devices.

Studies have shown that silicon germanium (SiGe) material allows for greater hole mobility compared to pure silicon material. Therefore, recent trends in finFET technology have led to semiconductor devices that utilize silicon germanium (SiGe) fins as opposed to silicon (Si) for p-type transistors.

Referring to FIGS. 1A-1D, a conventional fabrication method for forming a finFET semiconductor device 100 including a SiGe fin 102 is illustrated. In general, a SiGe fin 102 is initially formed on a surface of a semiconductor substrate 104 as illustrated in FIG. 1A. This may be done, for example, by epitaxial growth of a SiGe layer on a silicon substrate, wherein the SiGe layer becomes compressively strained as a result of the lattice matching of Ge atoms to Si atoms in the substrate 104. The SiGe layer is patterned as known in the art to form the compressively strained SiGe fin 102. Referring to FIG. 1B, a sacrificial gate layer 106 (i.e., dummy gate layer) is deposited on the substrate 104, which covers the SiGe fin 102. Turning to FIG. 1C, the sacrificial gate layer 106 is patterned to form a dummy gate element 107. The etching process used to pattern form the dummy gate element 107 also recesses the height of the SiGe fin 102 (i.e., pulls down the SiGe fin) as further illustrated in FIG. 1C. Referring to FIG. 1D, a block spacer layer 108 is deposited on the substrate 104 and covers the previous etched portions of the SiGe fin 102 and the upper surface of the dummy gate element 107. Referring to FIG. 1E, the block spacer layer 108 is anisotropically etched to form gate spacers 110 that define a gate stack 112 wrapping around the SiGe fin 102. However, etching process used to form the gate spacers also etches the underlying SiGe fin 102 and further reduces the fin height as illustrated in FIG. 1E. The resulting SiGe fin 120 is therefore has dual cut-outs on opposing sides of the dummy gate element 107 and spacers 108. That is, a first stepped portion 114 of the SiGe fin 102 is formed beneath dummy gate element 107, while a second stepped portion 116 of the SiGe fin 102 is formed below the first stepped portion 114 as illustrated in FIG. 1F. Consequently, when forming the gate stack 112 according to conventional fabrication methods, the underlying SiGe fin 102 is also etched which partially relaxes the compressive strain, i.e., reduces the strain, in the source/drain region as illustrated in FIG. 1G. The loss in strain can be as much as approximately 50% of the original strain created when forming the initial semiconductor fin. The strain relaxation typically increases as the fin extends from the gate spacers toward the opposing end of the fin 102. Therefore, the strain relaxation degrades overall device performance.

SUMMARY

According to at least one embodiment of the present invention, a semiconductor device includes at least one semiconductor fin on an upper surface of a base substrate. The at least one semiconductor fin includes a strained active semiconductor portion interposed between a protective cap layer and the base substrate. A gate stack wraps around the at least one semiconductor fin. The gate stack includes a metal gate element interposed between a pair of first cap segments of the protective cap layer. The strained active semiconductor portion is preserved following formation of the fin via the protective cap layer.

According to another embodiment, a method of fabricating a semiconductor device comprises forming at least one semiconductor fin on an upper surface of a base substrate to induce a strain in an active semiconductor portion of the at least one semiconductor fin. The at least one semiconductor fin has a protective cap layer formed on an upper surface thereof. The method further includes forming a gate layer that wraps around the at least one semiconductor fin and the protective cap layer. The method further includes etching the gate layer to form a gate element on an upper surface of the protective cap layer while the protective cap layer prevents etching of the active semiconductor portion and preserves the strain.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing features are apparent from the following detailed description taken in conjunction with the accompanying drawings in which:

FIGS. 1A-1G illustrate a conventional fabrication method of forming a semiconductor device including a SiGe fin;

FIG. 4A illustrates a partial view of the compressively strained fin shown in FIG. 3A following formation of a dummy gate layer that wraps around the upper surface of semiconductor cap and sidewalls of the compressively strained fin;

FIG. 4B illustrates the substrate in the second orientation and showing the dummy gate layer wrapping around the compressively strained fin;

FIG. 5A illustrates the substrate of FIGS. 4A-4B following an etching process that partially etches the dummy gate layer to expose portions of the second semiconductor layer that define source/drain regions;

FIG. 5B illustrates the substrate of FIG. 5A in the second orientation;

DETAILED DESCRIPTION

According to at least one non-limiting embodiment, a finFET semiconductor device is provided that includes one or more SiGe fins that preserves strain in the source/drain regions of the SiGe fin. The finFET semiconductor device includes a protective silicon cap layer to protect the SiGe fin during gate etching process thereby preventing SiGe loss and strain relaxation. In this manner, strain of the SiGe fin is fully preserved such that overall device performance is improved compared to conventional SiGe finFET devices. According to an embodiment, the Si cap located on top of the exposed fin after dummy gate removal can be removed before high-k/metal gate formation without comprising the strained SiGe fin. The technical effects achieved when including the Si cap include improved hole mobility that is approximately twice the hole mobility provided by conventional SiGe finFET devices. Accordingly, a finFET semiconductor device including the Si cap according to at least one embodiment of the disclosure can increase the effective current (Ieff) flow through the SiGe fin by, for example, around 25%.

Figure 1A:
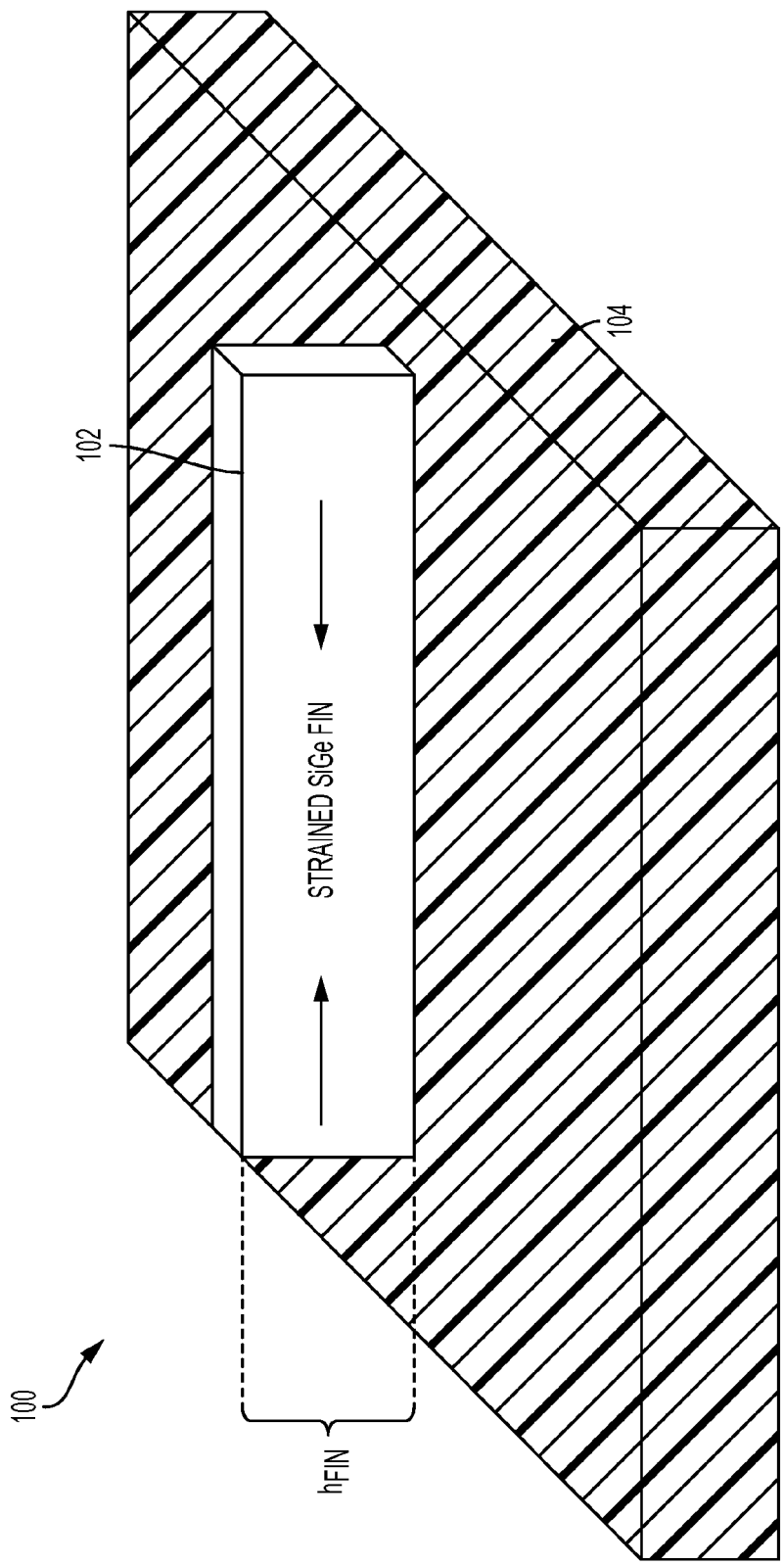
Figure 1B:
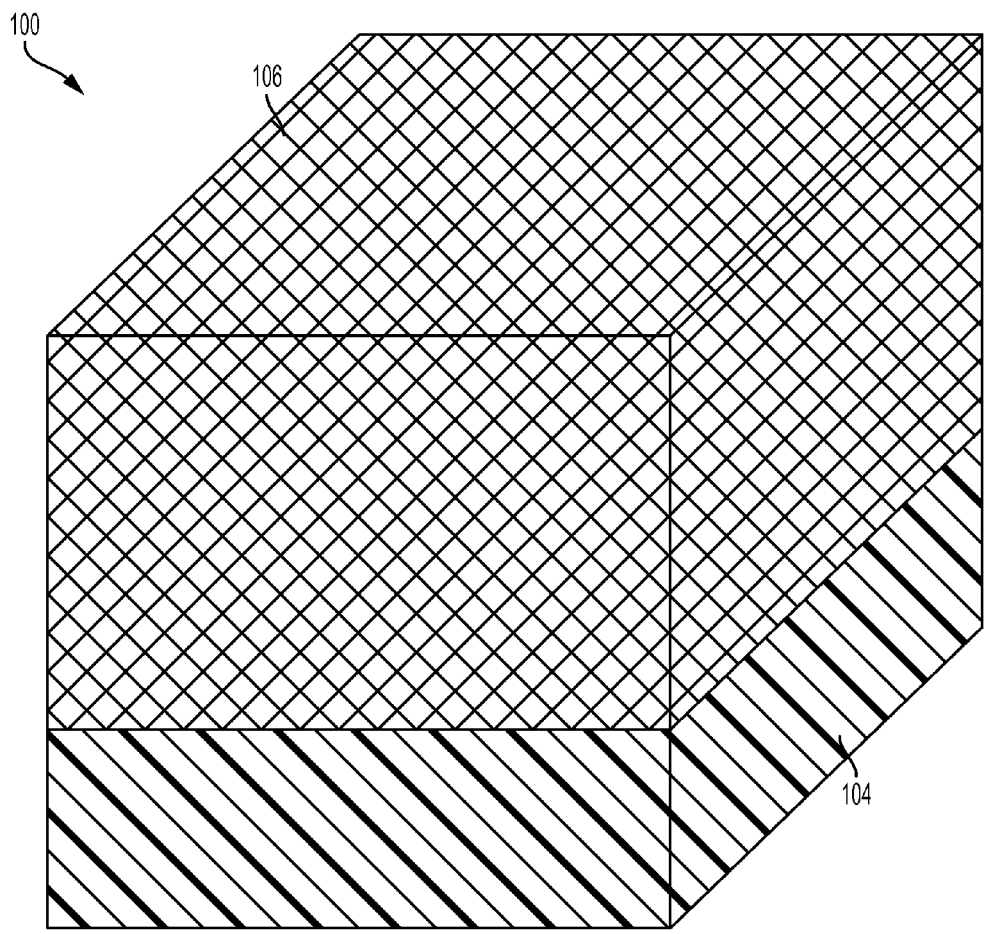
Figure 1D:
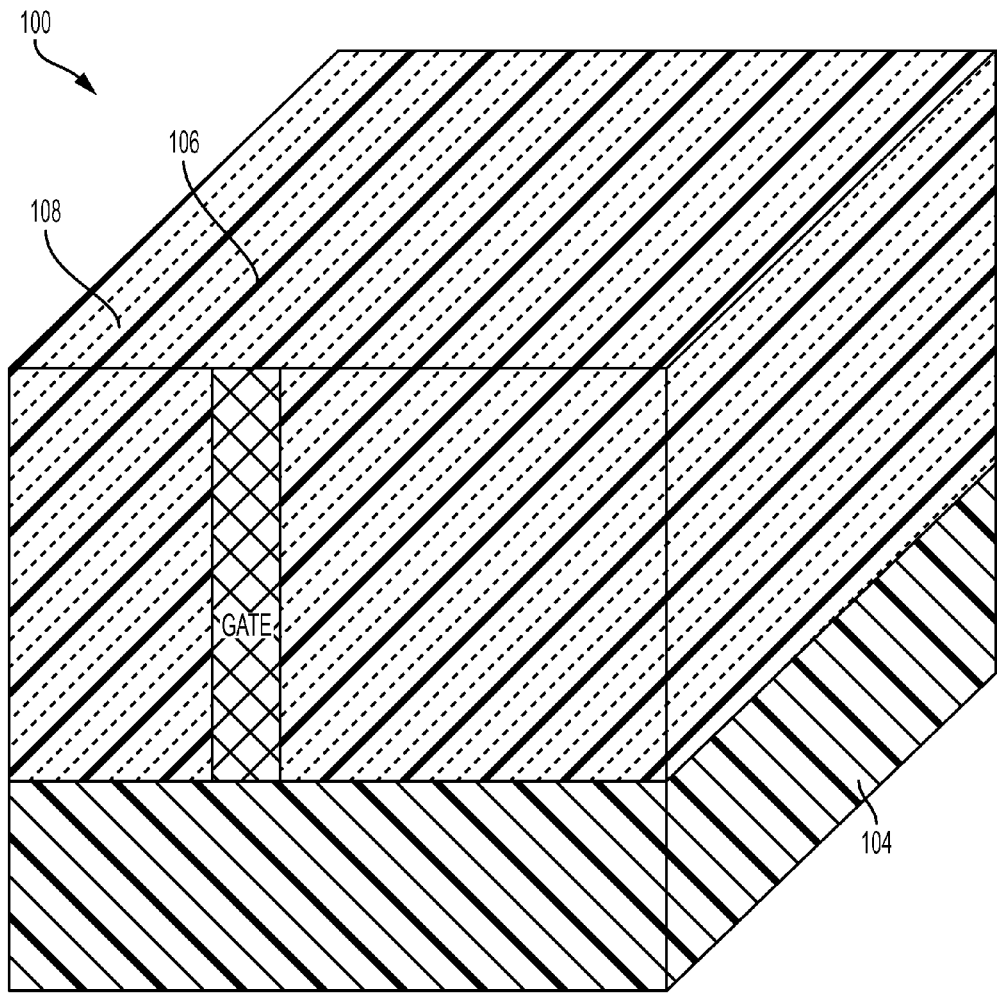
Figure 1E:
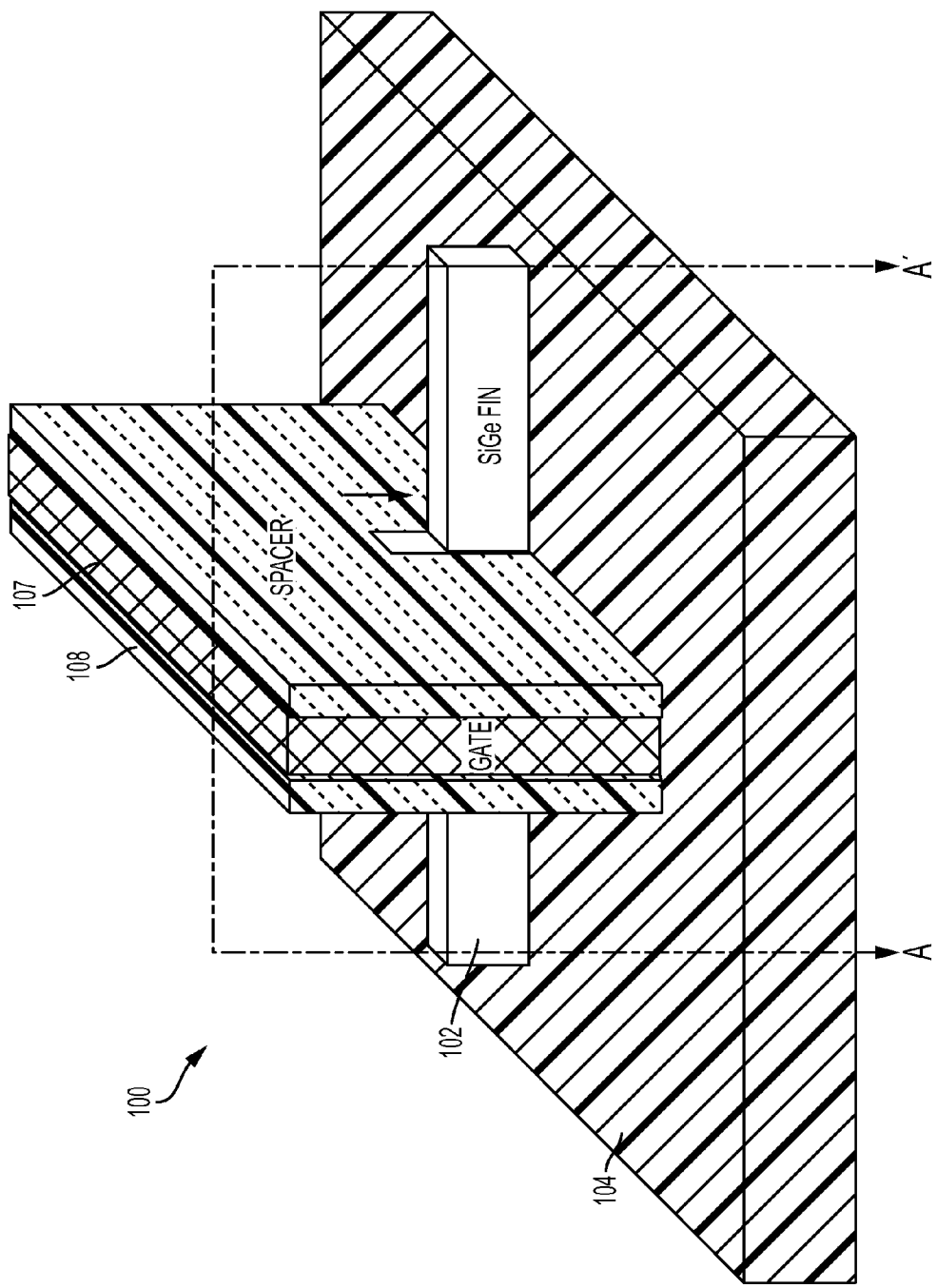
Figure 1F:
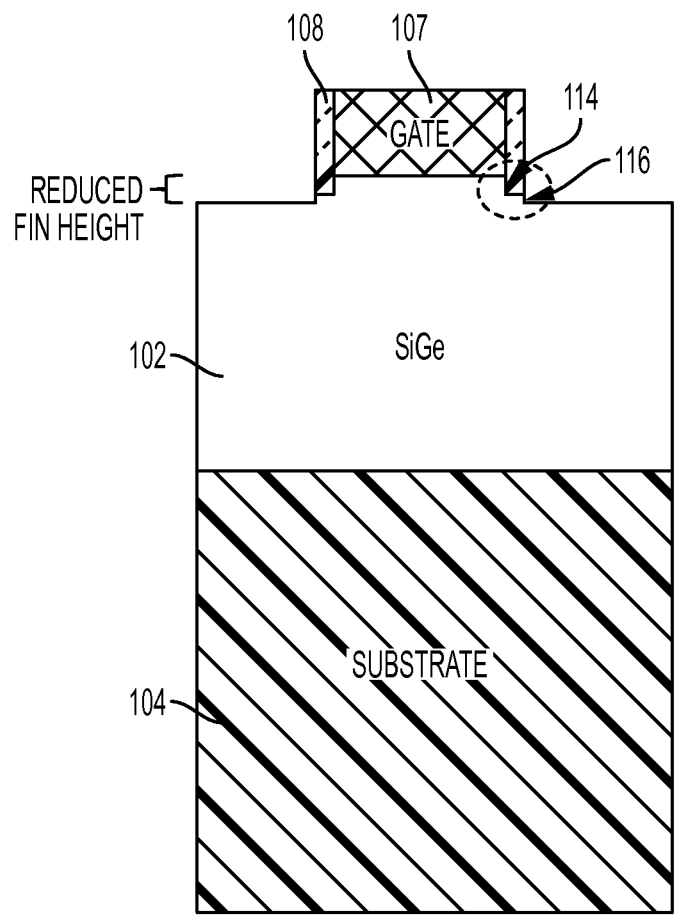
Figure 1G:
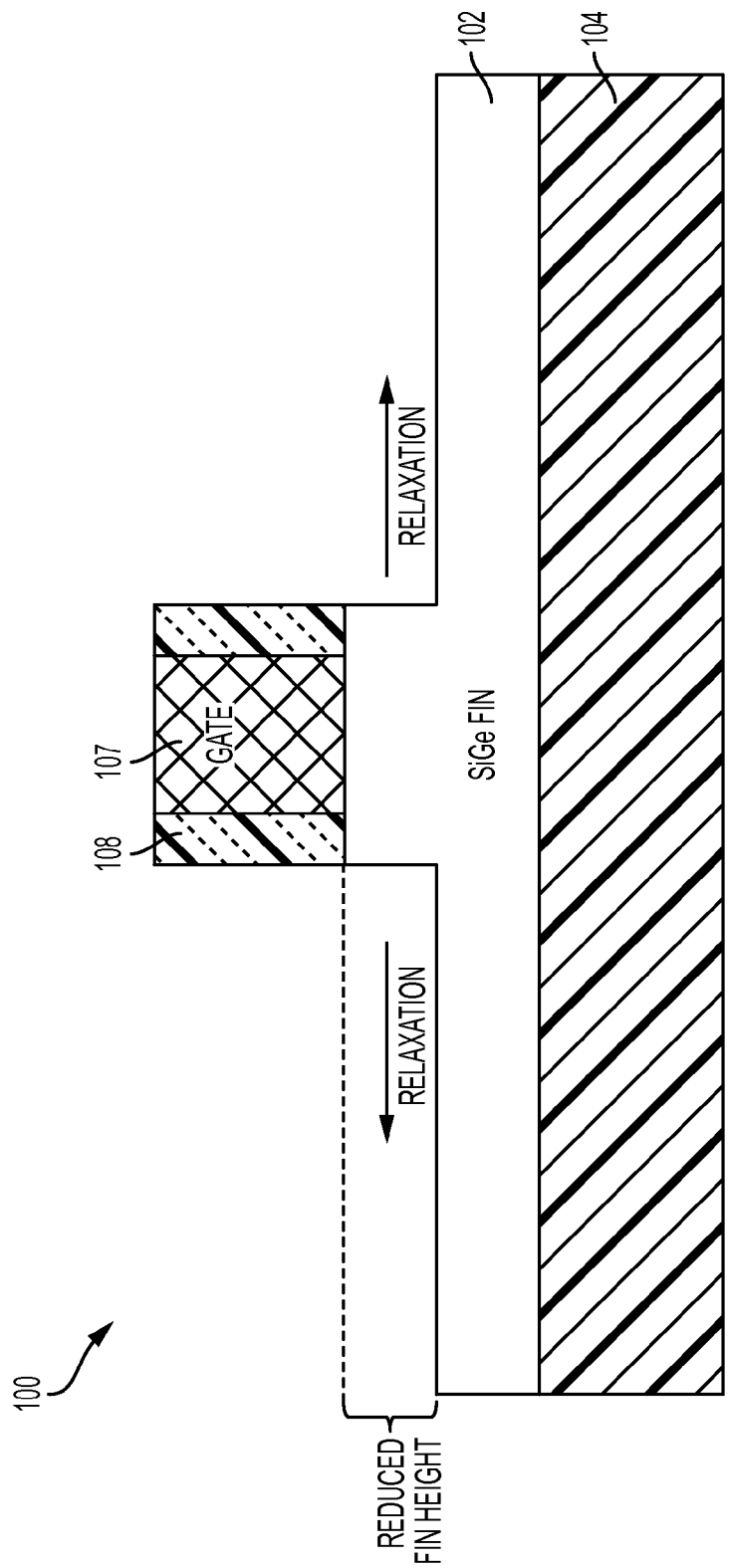
Figure 2A:
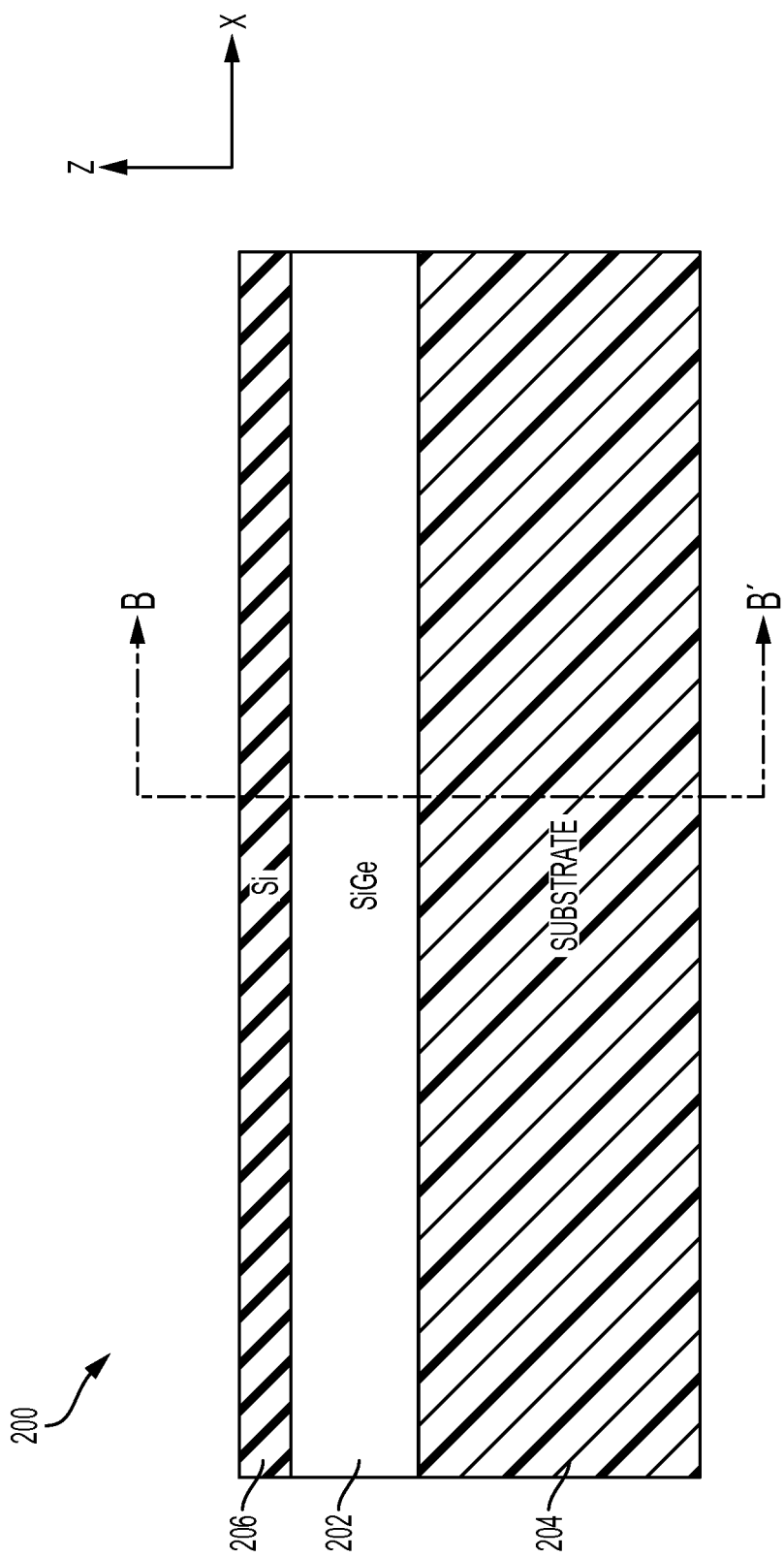
FIG. 2A illustrates starting substrate in a first orientation and including first semiconductor layer formed on an upper surface of a base semiconductor layer, and a second semiconductor on an upper surface of the first semiconductor layer.
Figure 2B:
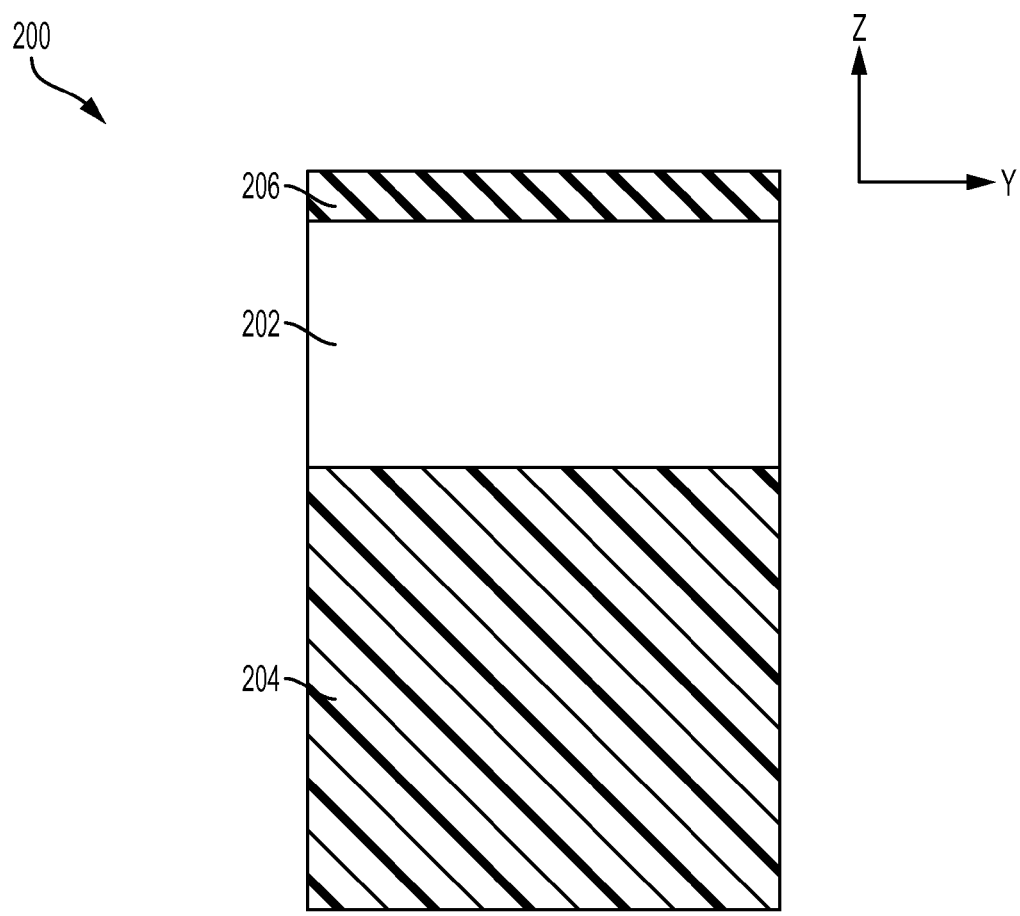
FIG. 2B is a cross-sectional view of the starting substrate shown in FIG. 2A taken along the lines B-B' showing the starting substrate in a second orientation.

With reference now to FIGS. 2A-2B, a starting substrate of a semiconductor device 200 is illustrated according to a non-limiting embodiment. The starting substrate may be formed as a semiconductor-on-insulator (SOI) substrate, or a bulk substrate. If formed as bulk substrate, the starting substrate may also include one or more shallow trench isolation (STI) regions as understood by one of ordinary skill in the art. According to a non-limiting embodiment, the starting substrate includes an active semiconductor layer 202 interposed between a base substrate layer 204 and a protective cap layer 206. More specifically, the semiconductor layer 202 is formed atop an upper surface of the base substrate layer 204. According to an embodiment, the base substrate layer 204 is formed from silicon (Si), and the active semiconductor layer 202 is formed from silicon germanium (SiGe). According to an embodiment, the active semiconductor layer 202 is epitaxially grown from the upper surface of the base substrate 204. In this manner, a compressive strain is induced in the active semiconductor layer 202, as understood by one of ordinary skill in the art, for majority carrier (hole) mobility enhancement of p-type FET devices. As further illustrated in FIGS. 2A-2B, the protective cap layer 206 is formed on an upper surface of the active semiconductor layer 202. According to a non-limiting embodiment, the protective cap layer 206 is formed from a semiconductor material such as, for example, silicon, and is epitaxially grown from the upper surface of the active semiconductor layer 202, i.e., the strained SiGe layer 202. The active semiconductor layer 202 may have a thickness ranging from approximately 20 nanometers (nm) to approximately 100 nm, and the protective cap layer 206 may have a thickness ranging from approximately 2 nm to approximately 10 nm.

Figure 3A:
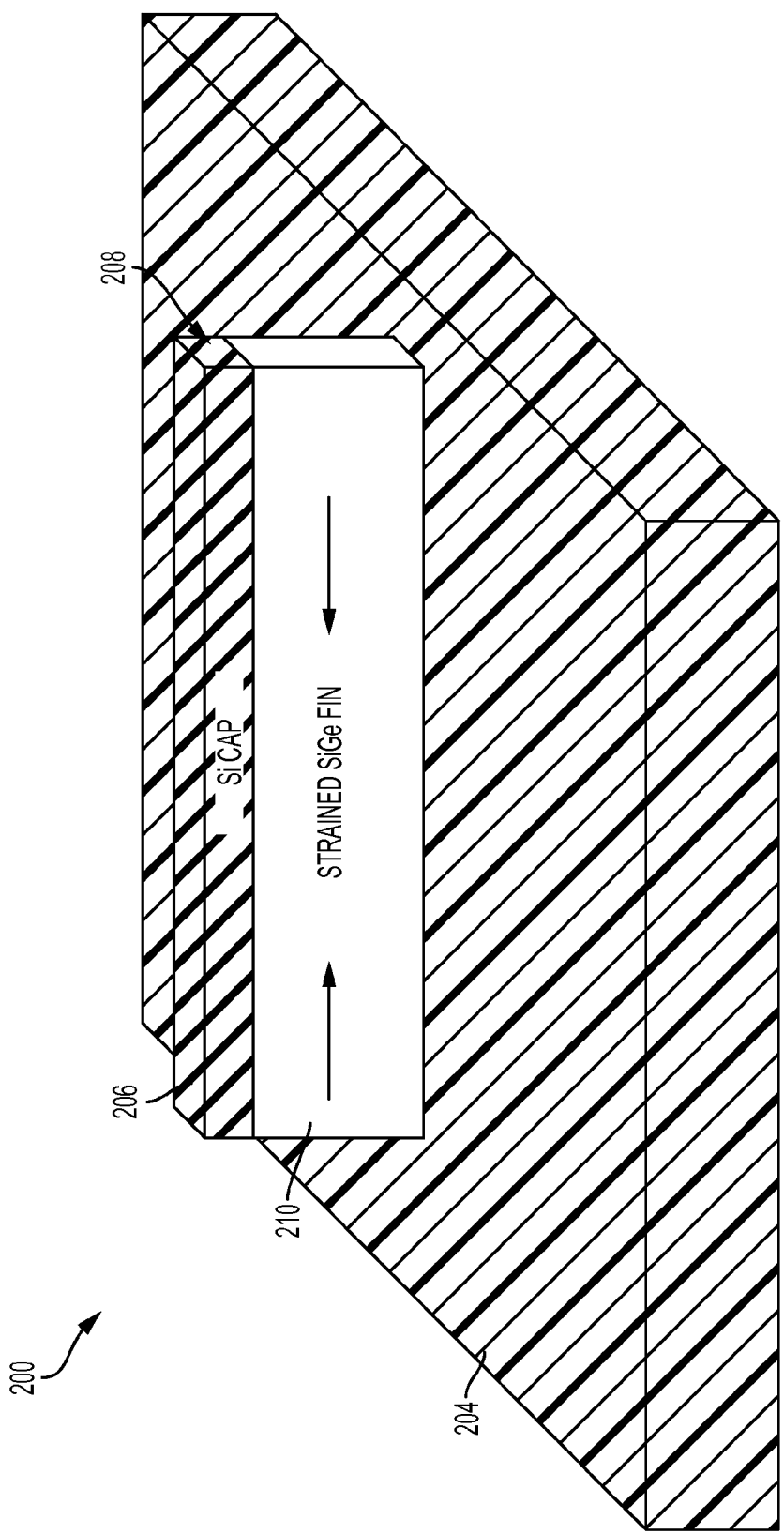
FIG. 3A illustrates the starting substrate of FIG. 2A in a third orientation and following an etching process that patterns the first and second semiconductor layers to form a compressively strained semiconductor fin on the base substrate layer, and a semiconductor cap on an upper surface of the semiconductor fin.
Figure 3B:
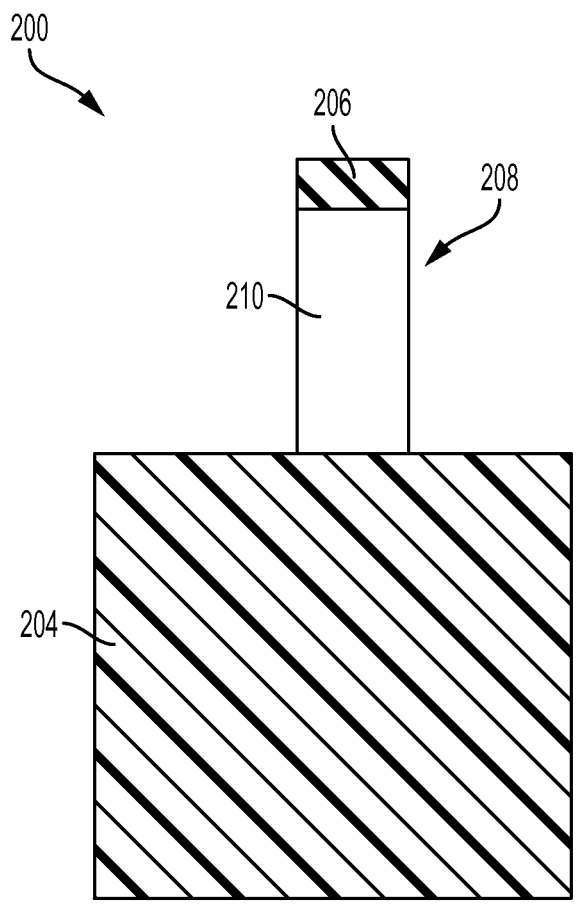
FIG. 3B illustrates the starting substrate of FIG. 3A in the second orientation.

Referring now to FIGS. 3A-3B, the starting substrate is etched to form one or more semiconductor fins 208 on an upper surface of the substrate layer 204. Various processes may be used to pattern the semiconductor fin 208 including, but not limited to, a sidewall image transfer (SIT) process as understood by one of ordinary skill in the art. Accordingly, the semiconductor fin 208 includes a strained active portion 210 that is interposed between the substrate layer 204 and the remaining protective cap layer 206. The strained active portion 210 maintains a compressive strain that improves hole mobility through the semiconductor fin 208.

Turning to FIGS. 4A-4B, a dummy gate layer 212 is formed on an upper surface of the protective cap layer 206. According to a non-limiting embodiment, the dummy gate layer 212 is formed from a sacrificial material such as, for example, polycrystalline silicon. Various methods may be used to deposit the dummy gate layer 212 including, for example, atomic layer deposition (ALD) such that the dummy gate layer 212 conforms to the semiconductor fin 208. That is, the dummy gate layer 212 can be deposited against all surfaces of the strained active portion 210 and the protective cap layer 206. As further illustrated in the cross-sectional view of FIG. 4B, a portion of the dummy gate layer 212 is also deposited on an upper surface of the base substrate 204 that became exposed after performing the etching process to form the semiconductor fin 208.

Figure 5C:
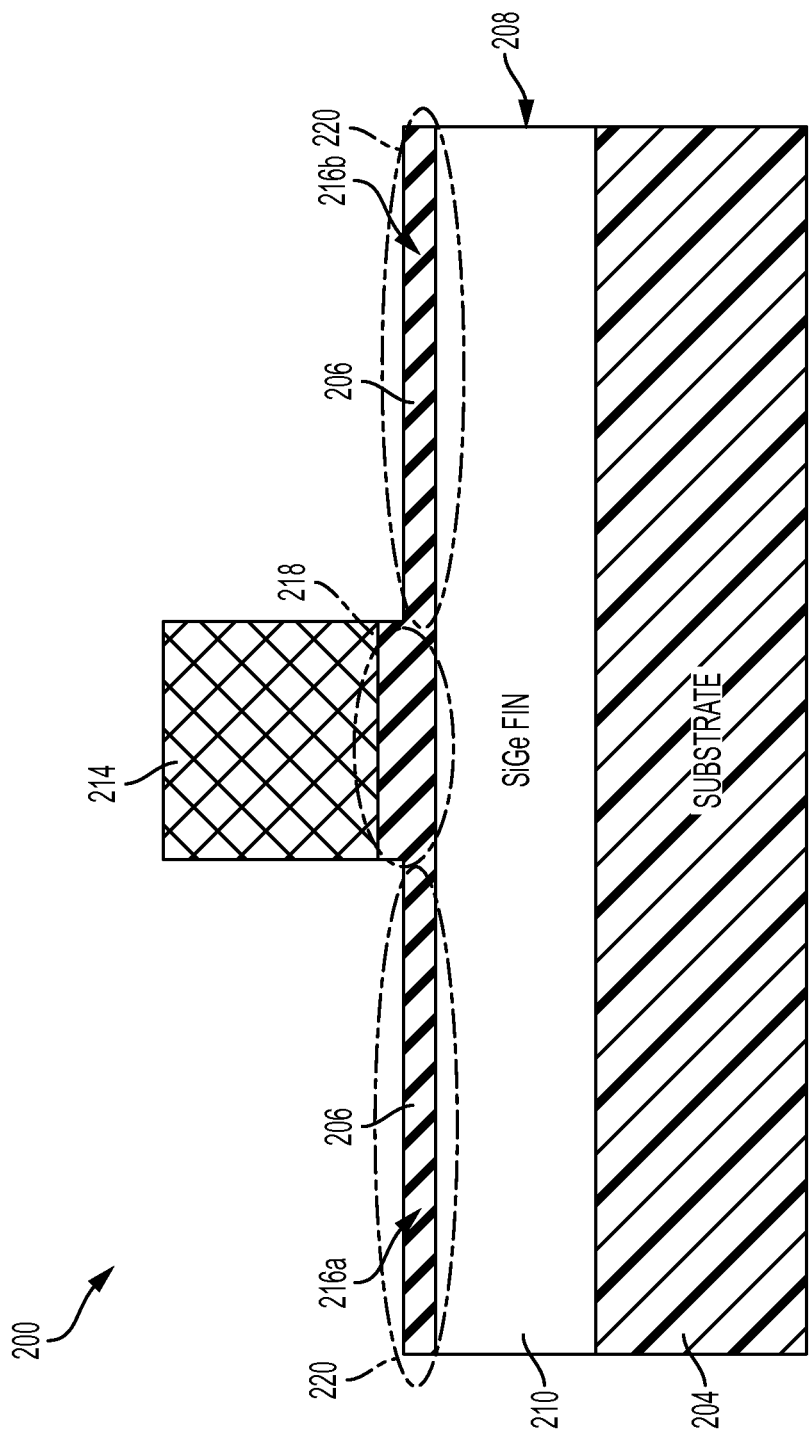
FIG. 5C is a cross-section of the substrate taken along line D-D' to show a protective cap layer including a first cap portion located beneath the gate material and a second cap portion located at source/drain regions of the fin.

Turning now to FIGS. 5A-5C, the dummy gate layer 212 is selectively etched to define a dummy gate element 214 which defines the location of a subsequently formed gate stack as discussed in further detail below. The dummy gate layer 212 is etched using, for example, a reactive ion etching (RIE) process to define a dummy gate element having a gate length with dimensions that can vary according to a desired design application. The RIE process results in a dummy gate element formed directly on an upper surface of the protective cap layer 206. The resulting RIE process also defines a source region 216a and a drain region 216b of the semiconductor fin 208. As further illustrated in FIG. 5C, the RIE process recesses the protective cap layer 206 outside the region covered by the dummy gate element 214, thereby resulting in a non-uniform profile. More specifically, the RIE process modifies the protective cap layer 206 so as to define a first cap portion 218 and a second cap portion 220. The first cap portion 218 is interposed between the gate element 214 and the strained active portion 210. The second cap portion 220 is formed on opposing sides of the first cap portion 218. That is, one second cap portion 220 is formed at the source region 216a, while another second cap portion 220 is formed at the drain region 216b. Since the first cap portion 218 is covered by the dummy gate element 214 during the RIE process, the first cap portion 218 has a first height that is greater than a second height of the second cap portion 220, thereby defining a non-uniform profile of the protective cap layer 206. Since only the protective cap layer 206 is recessed, the underlying strained active portion 210 is maintained and therefore the compressive stress is preserved.

Figure 6B:
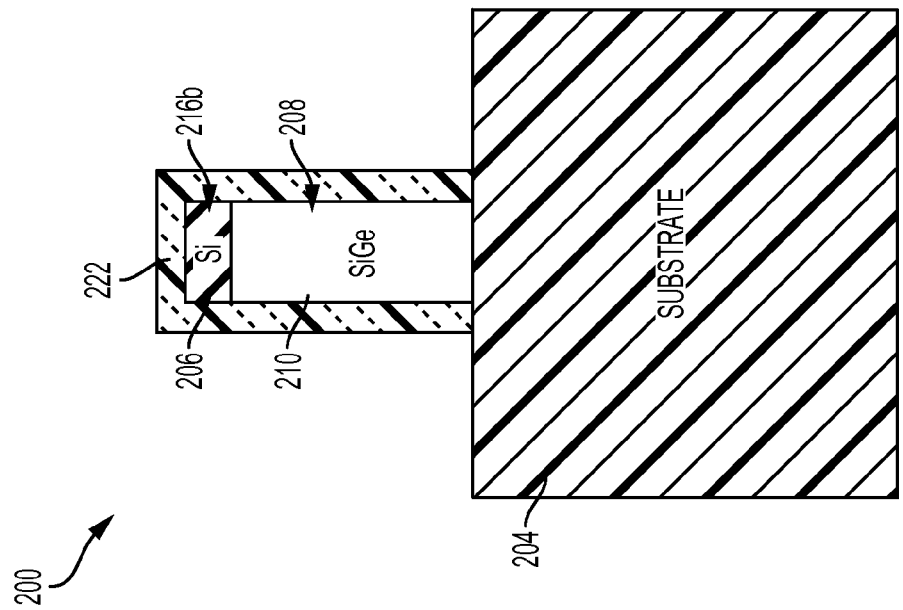
FIG. 6B is a cross-sectional view of a source/drain region of the compressed fin illustrated in FIG. 6A taken along the lines C-C' showing the conformal spacer layer formed on sidewalls of the first and second semiconductor layers and on an upper surface of the second semiconductor layer.
Figure 6A:
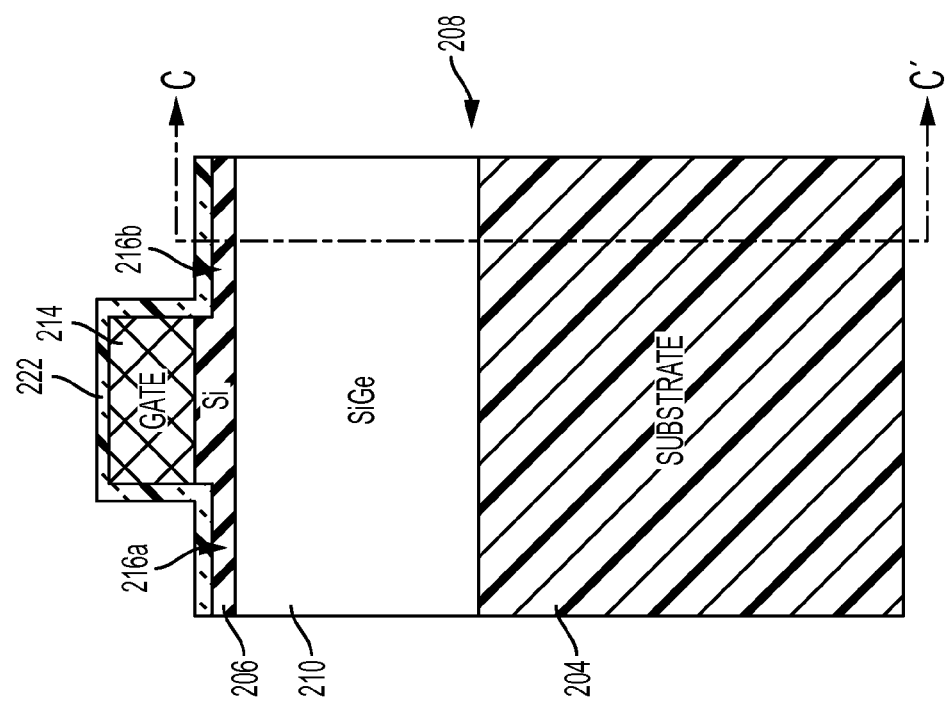
FIG. 6A illustrates a partial view of the substrate shown in FIGS. 5A-5B following deposition of a conformal spacer layer on the exposed source/drain regions and on the dummy gate layer.

Turning now to FIGS. 6A-6B, a spacer layer 222 is deposited on the substrate 204 which conforms to all surfaces of the protective cap layer 206 and the dummy gate element 214. The spacer layer 222 is formed from a dielectric material such as, for example, silicon nitride (SiN), and may be deposited using various techniques including, but not limited to, atomic layer deposition (ALD). As further illustrated in FIG. 6B, the spacer layer 222 conforms to all surfaces of the strained active portion 210 and the protective cap layer 206.

Figure 7B:
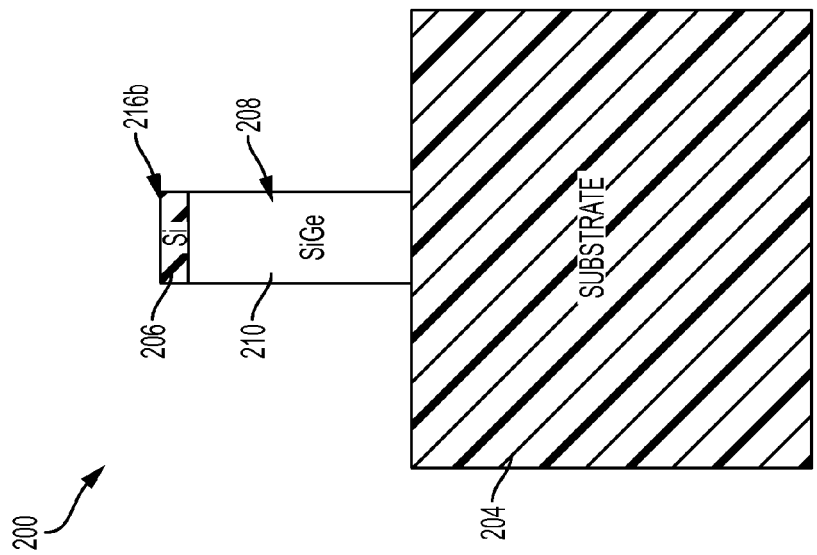
FIG. 7B illustrates the source/drain region of FIG. 6B following the etching process and showing the conformal spacer layer removed from the sidewalls of the first and second semiconductor layers and the upper surface of the second semiconductor layer.
Figure 7A:
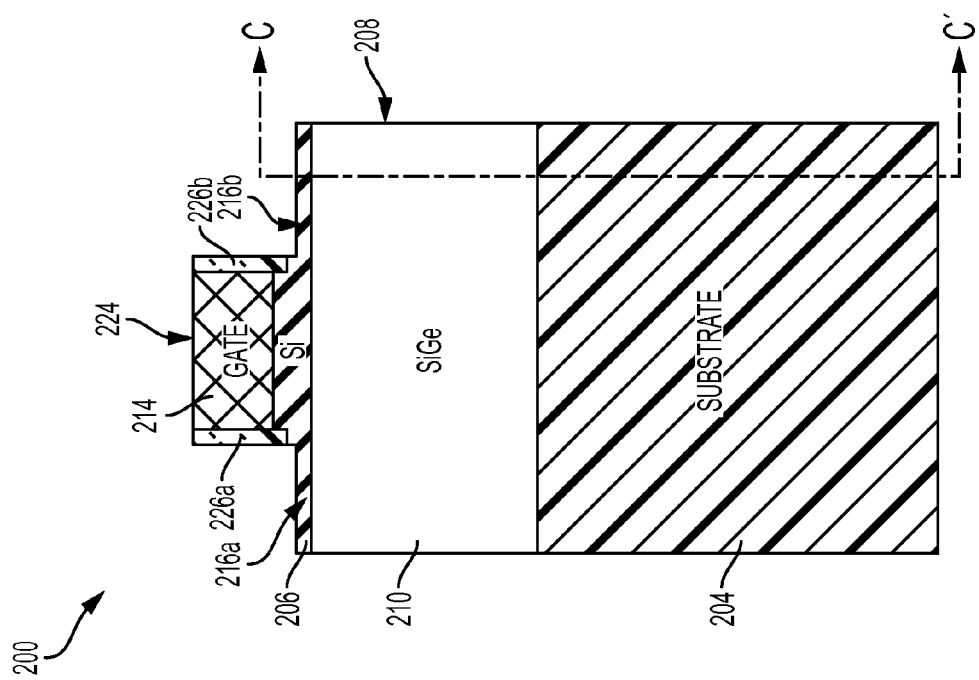
FIG. 7A illustrates the substrate of FIG. 6A following an etching process that removes a portion of the conformal spacer layer to expose the dummy gate layer and the second semiconductor layer.
Figure 7C:
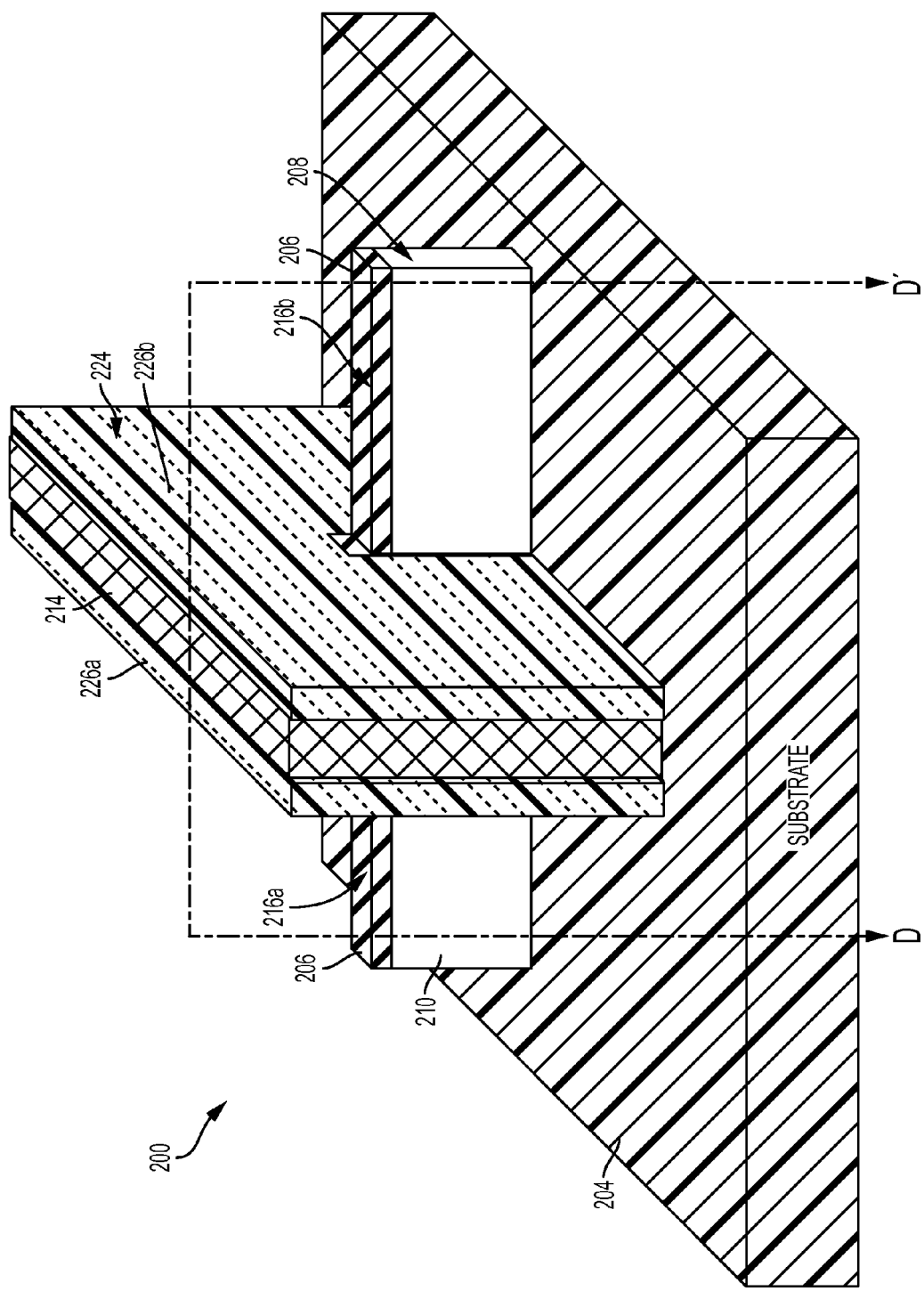
FIG. 7C is a perspective view of the substrate illustrated in FIGS. 7A-7B showing a gate stack including a dummy gate wrapping around a semiconductor fin including a partially etched portion of the second semiconductor layer atop the first semiconductor layer at the source/drain regions of the fin.
Figure 7D:
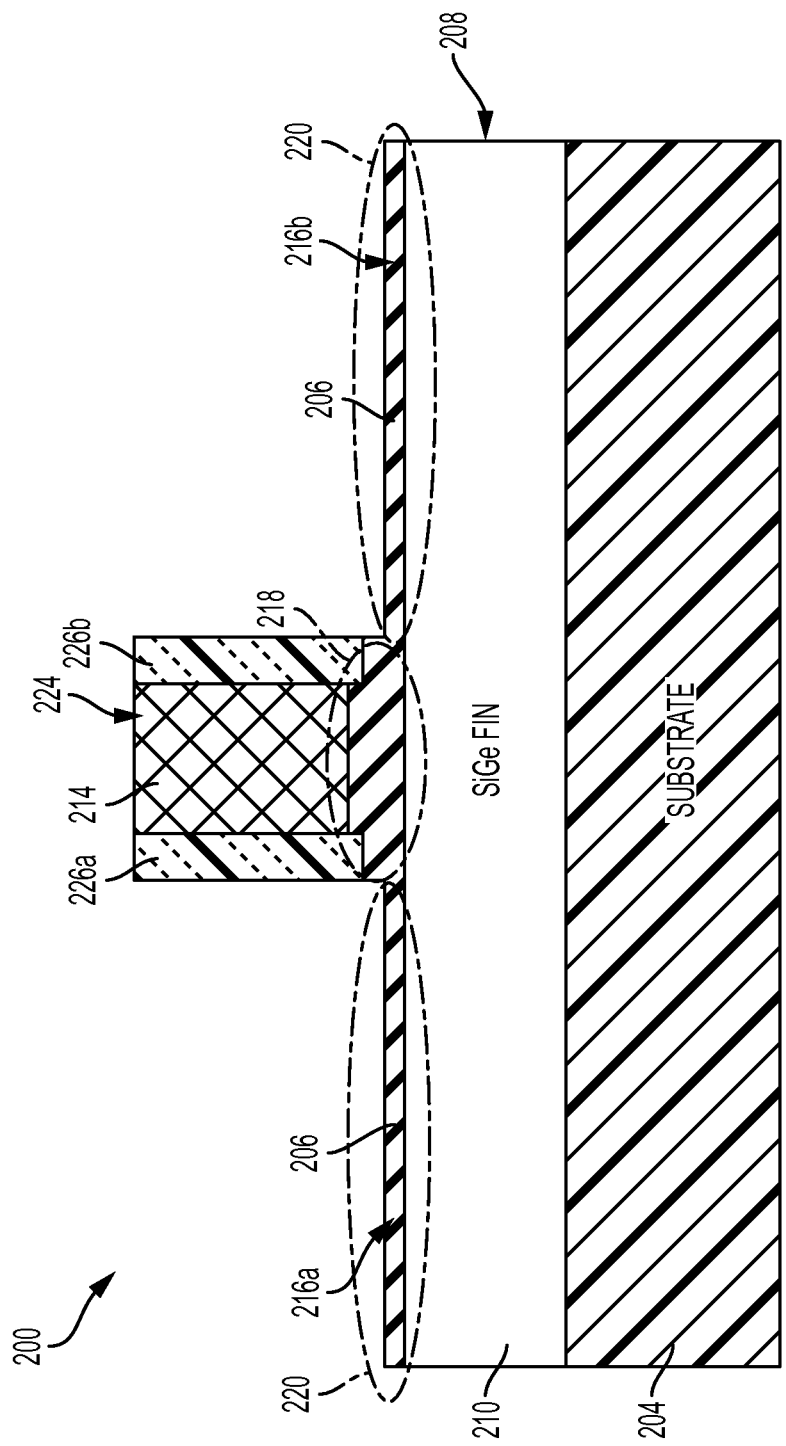
FIG. 7D is a cross-sectional view of the substrate shown in FIGS. 7A-7C taken along line D-D' showing the partially etched second semiconductor layer atop the first semiconductor layer at the source/drain regions of the semiconductor fin.

Referring now to FIGS. 7A-7B, the spacer layer 222 is patterned to form a dummy gate stack 224 having spacers 226a/226b. The spacers 226a/226b are formed on opposing sidewalls of the gate element 214 and on respective portions of the protective cap layer 206. The spacer layer 222 is patterned using, for example, a RIE process. As understood by one of ordinary skill in the art, the RIE process is anisotropic. Accordingly, portions of the spacer layer 222 deposited on the sidewalls of the gate element 214 are maintained to form the spacers 226a/226b, while the portion of the spacer layer 222 atop the gate element 214 and atop the sacrificial cap layer 206 are etched away. As further illustrated in FIG. 7A-7B, the RIE process is not fully selective, thereby further reducing the thickness of the protective cap layer 206, i.e., the second cap portion 220 (see FIG. 7D). Although the protective cap layer 206 is etched when forming both the dummy gate element 214 and the spacers 226a/226b, the protective cap layer 206 fully protects the strained active portion 210 of the semiconductor fin 208. That is, unlike conventional fabrication methods that etch the active portion (the SiGe) of the semiconductor fin, the sacrificial cap layer included in at least one non-limiting embodiment of the invention fully protects the strained active portion 210 of the semiconductor fin 208 during etching processes that form both the dummy gate element 214 and/or the gate spacers 226a/226b. In this manner, the strain of the active portion 210 is preserved after formation of the dummy gate stack 224 and spacers 226a/226b is completed.

Figure 8:
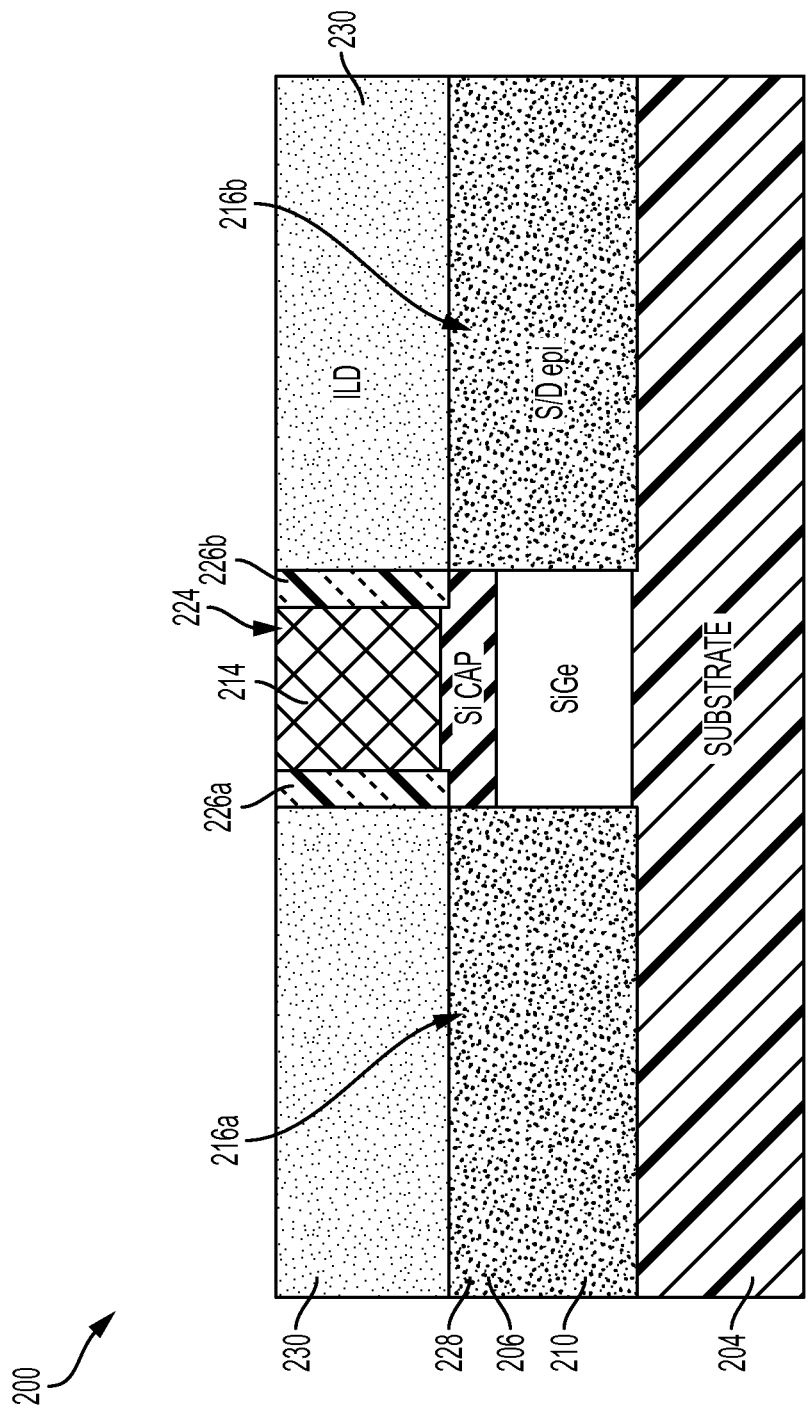
FIG. 8 is a cross-sectional view of the substrate shown in FIG. 7D after forming an epitaxial layer on the second semiconductor layer and an ILD layer on the epitaxial layer.
Figure 9:
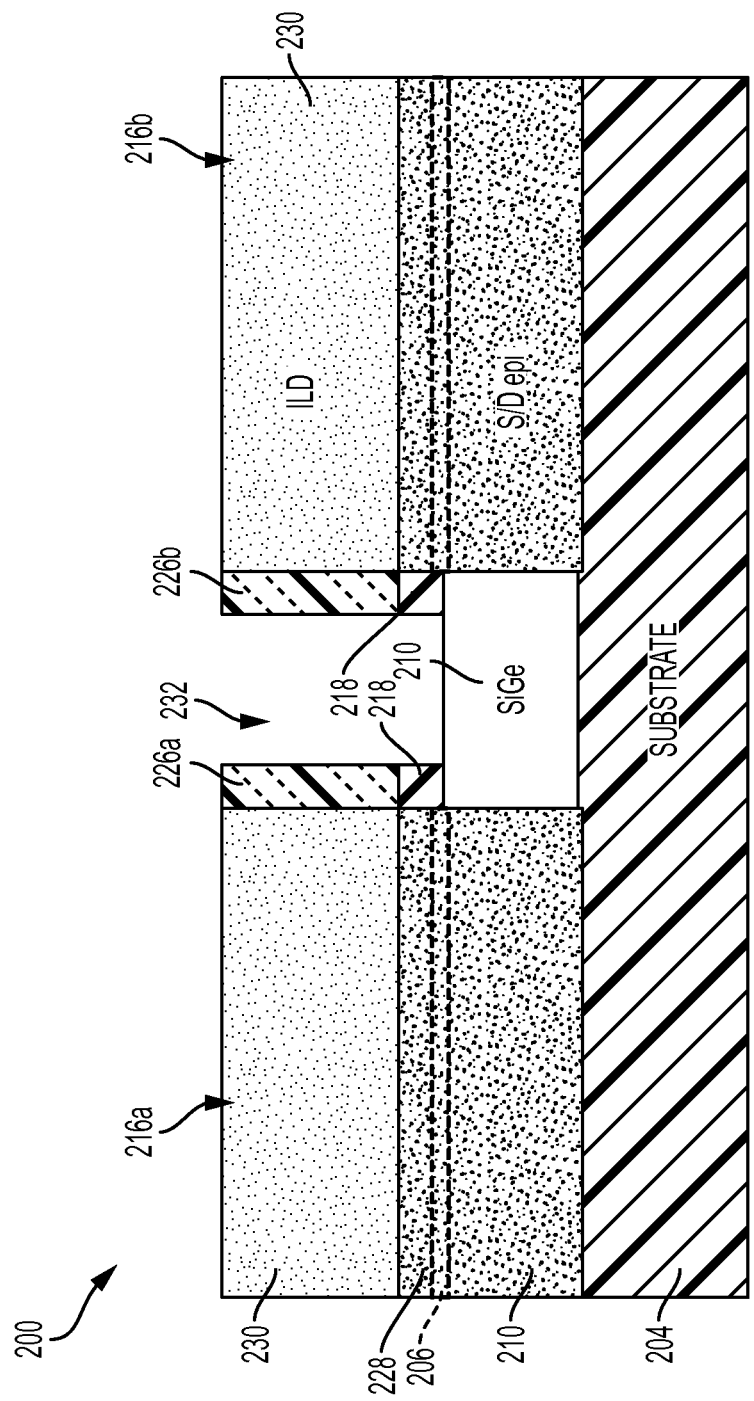
FIG. 9 is a cross-sectional view of the substrate shown in FIG. 8 after removing the dummy gate to form a void in the gate stack that exposes the underlying first semiconductor layer.
Figure 10:
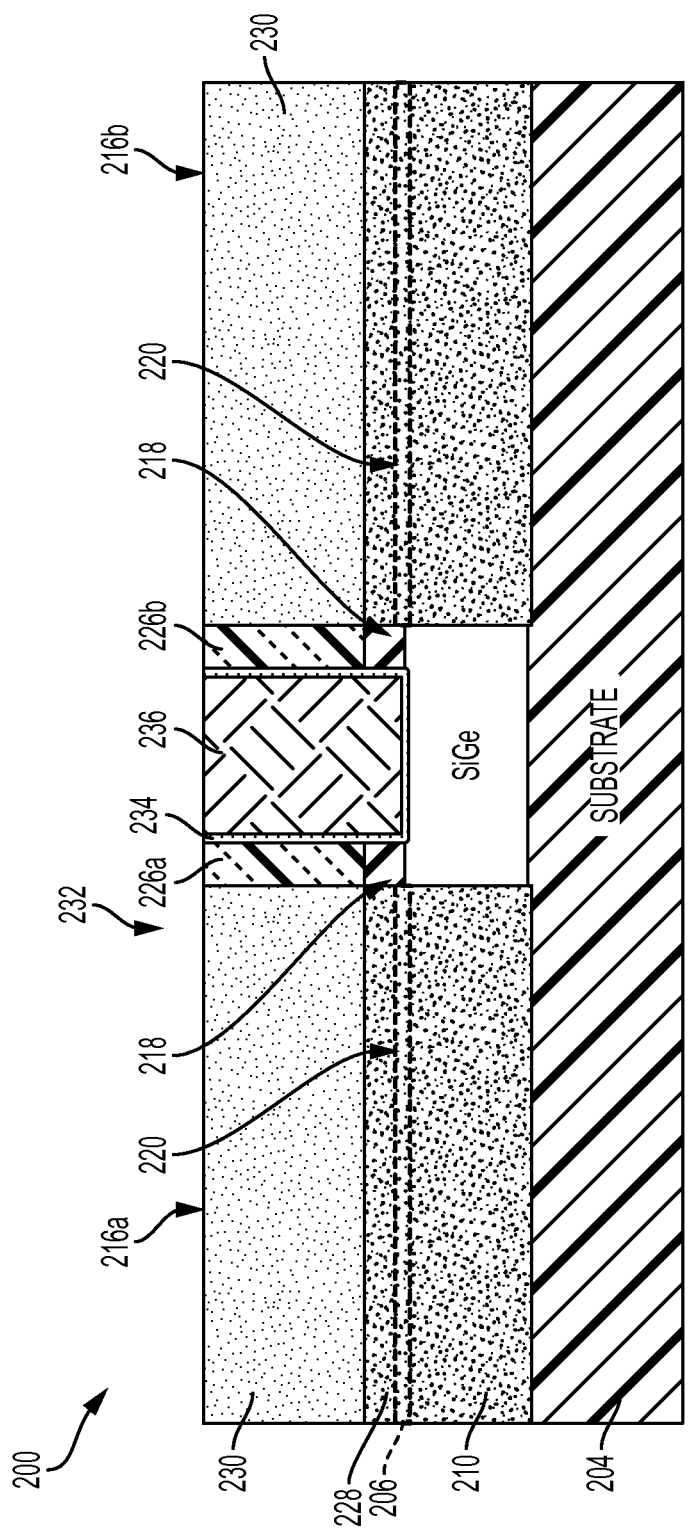
FIG. 10 is a cross-sectional view of the substrate shown in FIG. 9 after depositing a conformal gate dielectric film against the spacers of the dummy gate, sidewalls of the second semiconductor layer, and on an upper surface of the first semiconductor layer, and after depositing a metal gate material in the void and on the conformal gate dielectric film to form a metal gate contact.

Turning now to FIGS. 8-10, additional semiconductor fabrication processes such as, for example, metal gate replacement and source/drain contact formation, can be applied to the semiconductor device 200. With reference to FIG. 8, an epitaxial layer 228 comprising a semiconductor material is grown on all surfaces of the exposed strained active layer 210 and the protective cap layer 206 (i.e., the second cap portion) to complete the source/drain regions of the semiconductor fin 208. In this manner, the protective cap layer 206 is buried beneath the epitaxial layer 228 at the source/drain regions of the fin 208 according to a non-limiting embodiment. After forming the epitaxial layer 228, an interlevel dielectric (ILD) layer 230 is formed by dielectric deposition, followed by chemical mechanical polishing (CMP) process. The ILD layer 230 can be formed from various low-k dielectrics including, for example, silicon oxide ($SiO_2$), and can be deposited using chemical vapor deposition (CVD). The ILD layer 230 may serve to protect the source/drain regions 216a/216b when performing the metal gate replacement process, which is discussed in greater detail below.

Turning to FIG. 9, a replacement metal gate (RMG) process may be used to replace the dummy gate element 214 with a metal gate element, as understood by one of ordinary skill in the art. More specifically, the dummy gate element 214 is removed using a RIE process, for example, to form a void 232 in the gate region. As mentioned above, the ILD 230 may serve to protect the source/drain regions 216a/216b during the RIE process. The void 232 exposes sidewalls of the spacers 226a/226b, sidewalls of the remaining first cap portion 218, and an upper surface of the strained active portion 210.

Referring to FIG. 10, a conformal gate film 234 is deposited in the void 232 and conforms to all exposed surfaces of the spacers 226a/226b, the first cap portions 218, and the upper surface of the strained active portion 210. The thickness of the gate film 234 can range from approximately 10 nm to approximately 40 nm. The gate film 234 may be formed from various high-k dielectric materials including, but not limited to, hafnium dioxide ($HfO_2$). Thereafter, a gate metal material 236 (including any workfunction layers as known in the art) is deposited against the gate film 234 to fill the previous void 232. The gate metal material 236 may be formed from various metals including, but not limited to, tantalum (Ta) and tantalum nitride (TaN). It should be appreciated that a chemical mechanical planarization (CMP) process can be applied such that the gate metal material 236 is flush with the gate film 234, the spacers 226a/226b, and the ILD 230. As further illustrated in FIG. 10, each spacer 226a/226b is formed directly on an upper surface of a respective segment of the first cap portion 218.

Figure 11:
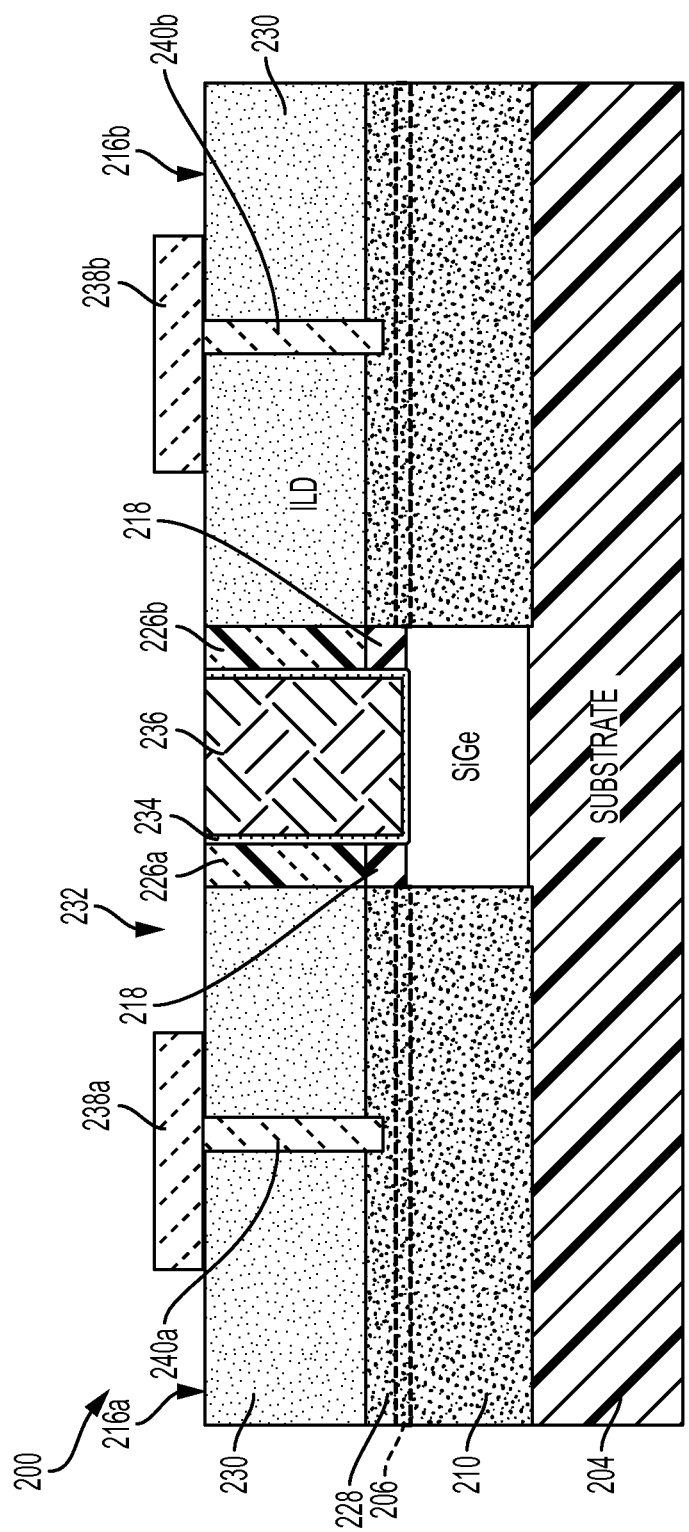
FIG. 11 is a cross-sectional view of the substrate shown in FIG. 10 after forming electrical contacts in the source/drain regions of the semiconductor device.

Referring now to FIG. 11, a first electrically conductive contact 238a is formed on an upper surface of the ILD 230 and a second electrical contact 238b is formed on an upper surface of the ILD 230. The first and second electrical contacts 238a/238b are electrically connected to the epitaxial layer 228 using an electrically conductive via 240a/240b, respectively. The electrical contacts 238a/238b and vias 240a/240b may be formed from various electrically conductive metals as understood by one of ordinary skill in the art. Although the ILD 230 is shown as being maintained, it should be appreciated that the ILD 230 can be removed, and the contacts 238a/238b can be formed directly on the epitaxial layer 228.

As described in detail above, various embodiments of the disclosure provide a finFET semiconductor device that includes a protective cap layer to protect the SiGe fin during various etchings process. Since the strained active portion, e.g., the SiGe portion, of the semiconductor fin is not attacked during etching process, SiGe loss and strain relaxation is prevented. In this manner, strain of the SiGe fin is fully preserved such that overall device performance is maintained as compared to that of a relaxed fin.

As used herein, the term module refers to a hardware module including an Application Specific Integrated Circuit (ASIC), an electronic circuit, a processor (shared, dedicated, or group) and memory that execute one or more software or firmware programs, a combinational logic circuit, and/or other suitable components that provide the described functionality.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the inventive teachings and the practical application, and to enable others of ordinary skill in the art to understand the invention for various embodiments with various modifications as are suited to the particular use contemplated.

The flow diagrams depicted herein are just one example. There may be many variations to this diagram or the operations described therein without departing from the spirit of the invention. For instance, the operations may be performed in a differing order or operations may be added, deleted or modified. All of these variations are considered a part of the claimed invention.

While various embodiments have been described, it will be understood that those skilled in the art, both now and in the future, may make various modifications which fall within the scope of the claims which follow. These claims should be construed to maintain the proper protection for the invention first described.

What is claimed is:

1. A method of fabricating a semiconductor device, the method comprising:

forming at least one semiconductor fin on an upper surface of a base substrate to induce a strain in an active semiconductor portion of the at least one semiconductor fin, the at least one semiconductor fin having a protective cap layer formed on an upper surface thereof, wherein forming the at least one semiconductor fin comprises:
  forming an active semiconductor layer on an upper surface of the base substrate such that the strain is induced in the active semiconductor layer;
  forming the protective cap layer that entirely covers an upper surface of the active semiconductor layer; and
  etching the active semiconductor layer and the protective cap layer to form the at least one semiconductor fin including the active semiconductor portion having the strain interposed between the base substrate and the protective cap layer, wherein the etched protective cap entirely covers an upper surface of the active semiconductor portion of the at least one semiconductor fin;
after etching the protective cap layer to entirely cover the upper surface of the active semiconductor portion, forming a gate layer that wraps around the at least one semiconductor fin and the protective cap layer;
etching the gate layer to form a dummy gate element on an upper surface of the protective cap layer and between first and second source/drain regions of the at least one semiconductor fin while the protective cap layer prevents etching of the active semiconductor portion and preserves the strain, the dummy gate element including a base that is formed directly on the protective cap layer and that extends between opposing gate sidewalls;
forming a spacer layer on an upper surface of the protective cap layer to cover the dummy gate element;
performing an anisotropic etching process that removes a portion of the spacer layer from an upper surface of the dummy gate element and the protective cap layer to form a first cap segment comprising a semiconductor material, and a gate stack on the protective cap layer, the gate stack including opposing spacers formed on opposite sides of the dummy gate element such that a base of the dummy gate element extends fully between the spacers, the protective cap layer prevents etching of the active semiconductor portion and preserves the strain while removing a portion of the spacer layer; and
replacing the dummy gate element with a metal gate element such that the first cap segment is formed against sidewalls of the metal gate element.

2. The method of claim 1, wherein the first cap segment having a first height is formed beneath the dummy gate element, and a second cap segment having a second height is formed at the first and second source/drain regions of the at least one semiconductor fin.

3. The method of claim 2, wherein the first height of the first cap segment is greater than the second height of the second cap segment.

4. The method of claim 3, further comprising forming an epitaxial semiconductor layer on an upper surface of the second cap segment, and forming first and second inter-layer dielectric elements on the epitaxial semiconductor layer to form first and second contacts.

5. The method of claim 4, further comprising performing a replacement metal gate process that replaces the dummy gate element with a metal gate element.

6. The method of claim 5, wherein the replacement metal gate process comprises:

selectively etching the dummy gate element to form a void that exposes a portion of the first cap segment;

selectively etching the portion of the first cap segment to expose the active semiconductor portion;

depositing a gate dielectric film on sidewalls of the spacer layer, sidewalls of the remaining first cap portion, and an upper surface of the exposed active semiconductor portion; and depositing a metal material on the gate dielectric film to form a gate metal element.

7. The method of claim 1, wherein the active semiconductor portion is silicon germanium (SiGe) and the protective cap layer is silicon (Si).

8. The method of claim 1, wherein the gate layer comprises polysilicon and the spacer layer comprises silicon nitride (SiN).

9. The method of claim 1, wherein etching the gate layer further comprises performing a single etching process to remove opposing portions of the gate layer to form the dummy gate while also recessing portions of the protective cap layer at opposing sides of the dummy gate to define the first and second source/drain regions.

10. The method of claim 9, wherein the protective cap layer covers an entire upper surface of the first source/drain region and the second source/drain region such that the protective cap layer protects strain in the first and second source/drain regions when etching the gate layer to form the dummy gate.

* * * * *